United States Patent
Lim

(10) Patent No.: US 10,062,452 B2
(45) Date of Patent: Aug. 28, 2018

(54) SEMICONDUCTOR MEMORY DEVICE AND OPERATING METHOD THEREOF

(71) Applicant: SK hynix Inc., Gyeonggi-do (KR)

(72) Inventor: Jung-Ho Lim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/686,188

(22) Filed: Aug. 25, 2017

(65) Prior Publication Data

US 2018/0190366 A1    Jul. 5, 2018

(30) Foreign Application Priority Data

Dec. 30, 2016    (KR) .................... 10-2016-0183300

(51) Int. Cl.
*G11C 29/42* (2006.01)
*G06F 11/10* (2006.01)
*H03M 13/00* (2006.01)

(52) U.S. Cl.
CPC .......... *G11C 29/42* (2013.01); *G06F 11/1044* (2013.01); *G06F 11/1048* (2013.01); *H03M 13/61* (2013.01)

(58) Field of Classification Search
CPC .. G11C 29/42; G06F 11/1044; G06F 11/1048; H03M 13/61

USPC ........... 365/185.09, 185.17, 185.19, 185.24, 365/185.33, 189.07, 194, 222, 232, 233.1
See application file for complete search history.

(56) References Cited

U.S. PATENT DOCUMENTS

| | | | | |
|---|---|---|---|---|
| 7,203,115 B2 * | 4/2007 | Eto | ...................... | G11C 7/1006 365/222 |
| 2006/0056258 A1* | 3/2006 | Eto | ...................... | G11C 7/1006 365/222 |

FOREIGN PATENT DOCUMENTS

| | | |
|---|---|---|
| KR | 1020140125981 | 10/2014 |
| KR | 1020160023151 | 3/2016 |

* cited by examiner

*Primary Examiner* — Harry W Byrne
(74) *Attorney, Agent, or Firm* — IP & T Group LLP

(57) ABSTRACT

A semiconductor memory device may include a memory core unit including a plurality of memory cells suitable for storing data, an error correction code (ECC) control unit suitable for detecting an error of the data to output a flag signal corresponding to a result of detection of the error, and an address control unit suitable for adjusting a refresh interval of at least one memory cell that stores data in which the error is detected, or repairing the memory cell among the memory cells, in response to the flag signal.

19 Claims, 3 Drawing Sheets

SEMICONDUCTOR MEMORY DEVICE AND OPERATING METHOD THEREOF

CROSS-REFERENCE TO RELATED APPLICATION

This application claims priority under 35 U.S.C. § 119 to Korean Patent Application No. 10-2016-0183300, filed on Dec. 30, 2016 in the Korean Intellectual Property Office, the disclosure of which is incorporated herein by reference in its entirety.

TECHNICAL FIELD

Exemplary embodiments of the present disclosure relate to a semiconductor design technology and, more particularly, to a semiconductor memory device capable of detecting and correcting error of data stored in a memory cell.

DISCUSSION OF THE RELATED ART

Recently, in order to increase the operating speed of a semiconductor device, a method in which 4-bit or 8-bit data are input/output every clock cycle, such as double date rate 2 (DDR2), DDR3, or the like, is used. As the data input/output speed is increased, because the probability of error that occurs during the transmission of data is also increased, an additional device and method are required to secure the reliability of data transmission.

Existing methods for securing the reliability of data transmission include, whenever data are transmitted, generating an error code capable of checking whether error has occurred and transmitting the error code along with the data. There exist also various error detection codes including error detection codes capable of detecting when error has occurred, and/or autonomously correcting an error when the error occurs, and the like.

SUMMARY

Various embodiments are directed to provide a semiconductor memory device capable of performing an improved error correction and refresh control which take into consideration the number of error bits of data stored in a memory cell.

In an embodiment, a semiconductor memory device may include: a memory core unit including a plurality of memory cells suitable for storing data; an error correction code (ECC) control unit suitable for detecting an error of the data to output a flag signal corresponding to a result of detection of the error; and an address control unit suitable for adjusting a refresh interval of at least one memory cell that stores data in which the error is detected, or repairing the memory cell among the memory cells, in response to the flag signal.

The address control unit may be configured to adjust the refresh interval of the memory cell storing the data in which the error is first detected, and to repair the memory cell storing the data in which the error is repeatedly detected.

The address control unit may include: an address latch unit suitable for latching a row address, outputting a latched row address in response to the flag signal, and outputting the latched row address as a refresh address or a repair address in response to match information about whether the row address matches a refresh address; a refresh address latch unit suitable for latching an address corresponding to a default value or the refresh address, outputting a latched refresh address corresponding to the default value the flag signal, and outputting the latched refresh address corresponding to the refresh address in response to the match information; an address comparison unit suitable for outputting the match information by comparing the latched row address with the latch refresh address corresponding to the default value; a refresh control unit suitable for adjusting the refresh interval of the memory cell corresponding to the refresh address latched in the refresh address latch unit; and a row address repair unit suitable for repairing the memory cell corresponding to the repair address.

The refresh address latch unit may latch the refresh address when the match information denotes that the row address does not match the refresh address, and reset the refresh address latched therein when the match information denotes that the row address matches the refresh address.

The refresh control unit may be configured to control a refresh operation to be performed as one of an auto-refresh operation, a self-refresh operation, and a per-bank refresh operation.

The ECC control unit may be configured to detect an error bit of the data through Single Error Correct Double Error Detect (SECDED) code, to correct the error when the error bit is 1 bit, and to generate the flag signal when the error bit is 2 bits.

The address control unit may be configured to adjust the refresh interval to be shorter than a preset refresh interval.

The error bit may be detected when a retention time of the memory cell is shorter than a refresh time of the memory cell.

The semiconductor memory device may further include: a command address input unit suitable for generating an internal command/address signal by decoding a command/address signal received from an external device; an access control unit suitable for generating a row address, a column address, and a sense amplifier control signal in response to the internal command/address signal; a sense amplification unit suitable for sensing and amplifying the data stored in the memory core unit in response to the sense amplifier control signal; and a data input/output unit suitable for outputting the data, the error of which is corrected by the ECC control unit, and receiving input data from the external device to the memory core unit.

The ECC control unit may be configured to receive data sensed and amplified by the sense amplification unit in response to the column address.

The memory core unit may further include: a plurality of ECC memory cells suitable for storing parity bits for checking and correcting the error of the data.

In an embodiment, an operating method of a semiconductor memory device may include: storing data in at least one memory cell and storing a parity bit in at least one error correction code (ECC) memory cell; reading the data and the parity bit from the memory cell and the ECC memory cell; detecting the number of error bits of the data depending on the parity bit; correcting error of the data when the number of error bits is 1 bit; and adjusting a refresh interval of the memory cell or repairing the memory cell when the number of error bits is greater than 1.

The adjusting the refresh interval is performed when the number of error bits of the data is first detected as being greater than 1.

The adjusting the refresh interval may include: latching a row address in response to a flag signal indicating a case in which the number of the error bits is greater than 1; comparing the row address with a previously latched refresh address; and when the row address does not match the previously latched refresh address, latching the row address as the refresh address and adjusting the refresh interval of the memory cell corresponding to the row address.

The refresh interval may be adjusted to be shorter than a preset refresh interval.

The repairing the memory cell may be performed when the number of error bits of the data is repeatedly detected as being greater than 1.

The repairing the memory cell may include: latching a row address in response to a flag signal indicating a case in which the number of the error bits is greater than 1; comparing the row address with a previously latched refresh address; and when the row address matches the previously latched refresh address, repairing the memory cell corresponding to the row address.

The repairing the memory cell may further include: when the row address matches the previously latched refresh address, resetting the previously latched refresh address.

The detecting the number of error bits of the data may be performed by Single Error Correct Double Error Detect (SECDED) code.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Figure 1:
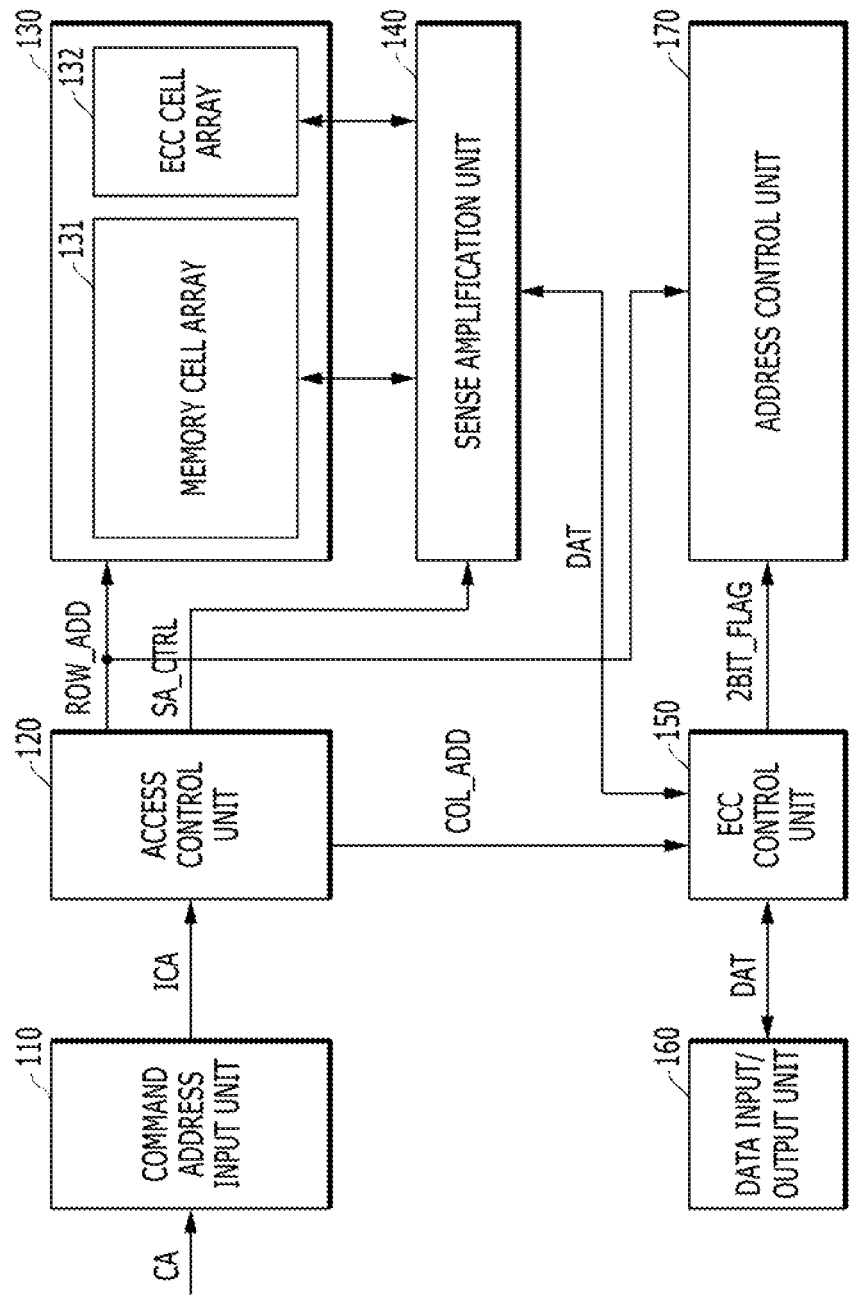
FIG. 1 is a block diagram of a semiconductor memory device in accordance with an embodiment of the present invention.

FIG. 1 is a block diagram illustrating a semiconductor memory device in accordance with an embodiment of the present invention.

Referring to FIG. 1, the semiconductor memory device may include a command address input unit 110, an access control unit 120, a memory core unit 130, a sense amplification unit 140, an ECC control unit 150, a data input/output unit 160, and an address control unit 170.

The command address input unit 110 may receive a command/address signal CA inputted from an external device (not shown), and generate an internal command/address signal ICA by buffering the received command/address signal CA. Here, the external device may be a memory controller.

The access control unit 120 may generate a row address ROW_ADD, a column address COL_ADD, and a sense amplifier control signal SA_CTRL in response to the internal command/address signal ICA. Although not illustrated in the drawing, the access control unit 120 may include a row decoder and a column decoder, wherein the row decoder may generate the row address ROW_ADD and the column decoder may generate the column address COL_ADD.

The memory core unit 130 may include a memory cell array 131 and an ECC cell array 132. The memory cell array 131 may include a plurality of memory cells in which written data DAT are stored, and the ECC cell array 132 may include a plurality of memory cells in which parity bits for checking and correcting an error of the written data DAT are stored.

The sense amplification unit 140 may sense, amplify, and output the written data DAT stored in all the memory cells in response to the sense amplifier control signal SA_CTRL after a refresh operation.

The ECC control unit 150 may detect error bits of the written data DAT outputted through the sense amplification unit 140, and may correct the error bits, or generate a 2-bit flag signal 2BIT_FLAG, depending on the number of error bits.

The ECC control unit 150 may be an ECC circuit using Single Error Correct Double Error Detect (SECDED) code that is capable of performing a 1-bit error correction, and a 2-bit error detection, e.g., a Hamming code. More specifically, when a 1-bit error occurs in the written data DAT, the ECC control unit 150 may correct the error and output corrected data DAT to the data input/output unit 160. When a 2-bit error occurs, the ECC control unit 150 may generate the 2-bit flag signal 2BIT_FLAG and output the 2-bit flag signal to the address control unit 170.

The data input/output unit 160 may perform operations for inputting and outputting the written data DAT. The data input/output unit 160 may output the written data DAT, the error of which is corrected by the ECC control unit 260, to the external device, and may receive input data DAT from the external device to the memory core unit 130.

The address control unit 170 may perform a refresh control operation or a repair operation on a memory cell corresponding to a defective address in response to the 2-bit flag signal 2BIT_FLAG received from the ECC control unit 150.

Figure 2:
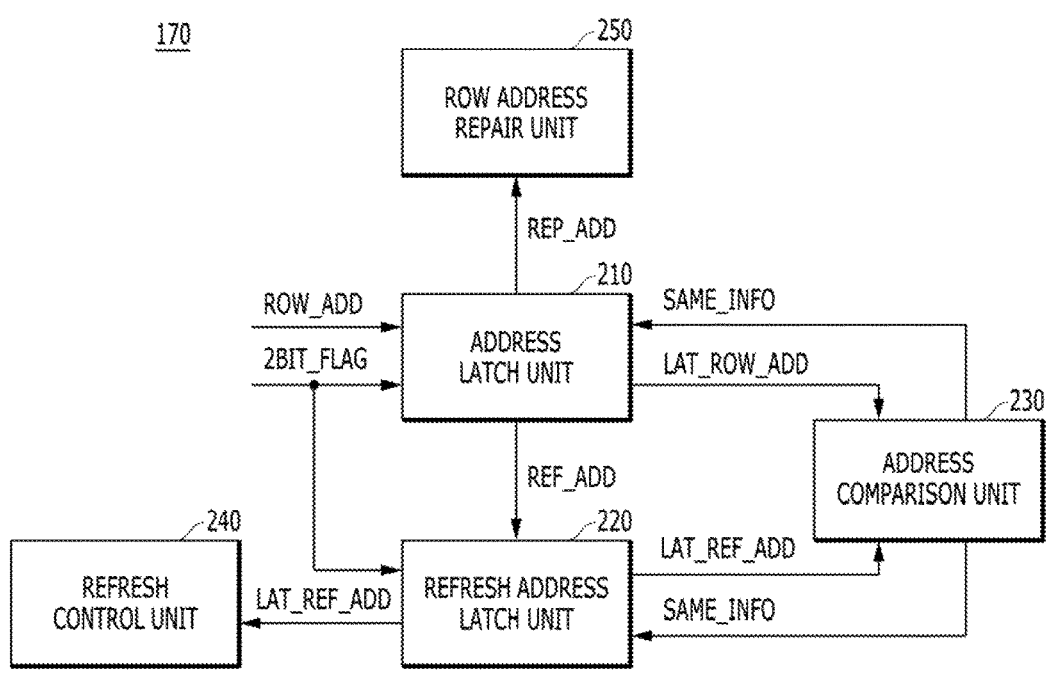
FIG. 2 is a block diagram illustrating an address control unit illustrated in FIG. 1.

Reference is to be made to FIG. 2 in order to explain the operation of the address control unit 170.

FIG. 2 is a block diagram illustrating the address control unit 170 illustrated in FIG. 1.

Referring to FIG. 2, the address control unit 170 may include an address latch unit 210, a refresh address latch unit 220, an address comparison unit 230, a refresh control unit 240, and a row address repair unit 250.

The address latch unit 210 may latch the row address ROW_ADD. The address latch unit 210 may output a latched row address LAT_ROW_ADD to the address comparison unit 230 in response to the 2-bit flag signal 2BIT_FLAG received from the ECC control unit 150.

The refresh address latch unit 220 may latch a refresh address REF_ADD outputted from the address latch unit 210. Here, the refresh address REF_ADD may be acquired in such a way that the row address ROW_ADD latched in the address latch unit 210 is outputted as the refresh address REF_ADD for a refresh operation The refresh address latch unit 220 may output a latched refresh address LAT_REF_ADD to the address comparison unit 230 in response to the 2-bit flag signal 2BIT_FLAG received from the ECC control unit 150.

The address comparison unit 230 may compare the latched row address LAT_ROW_ADD latched in the address latch unit 210 with the latched refresh address LAT_REF_ADD latched in the refresh address latch unit 220 to output match information SAME_INFO about whether the latched row address LAT_ROW_ADD and the latched refresh address LAT_REF_ADD match each other. The match information SAME_INFO outputted from the address comparison unit 230 may be inputted to the address latch unit 210 and the refresh address latch unit 220.

In response to the match information SAME_INFO which is outputted from the address comparison unit 230, the address latch unit 210 may output the latched row address LAT_ROW_ADD to the refresh address latch unit 220 as the refresh address REF_ADD, or may output the latched row address LAT ROW_ADDSAME_INFO to the row address repair unit 250 as a repair address REP_ADD.

In response to the match information SAME_INFO which is outputted from the address comparison unit 230, the refresh address latch unit 220 may output the latched refresh address LAT_REF_ADD corresponding to the refresh address REF_ADD to the refresh control unit 240.

The refresh control unit 240 may change a refresh interval for the latched refresh address LAT_REF_ADD outputted from the refresh address latch unit 220 to be shorter than a preset refresh interval, and may control a refresh operation to be performed based on the changed refresh interval. For the convenience of description, the preset refresh interval is called a first interval, and the refresh interval changed by the refresh control unit 240 is called a second interval.

The row address repair unit 250 may receive the repair address REP_ADD, and perform a repair operation for the repair address REP_ADD.

Hereinafter, referring to FIGS. 1 and 2, a description of an operation of the address control unit 170, configured as described above, will be made.

First, the address latch unit 210 may output the latched row address LAT_ROW_ADD to the address comparison unit 230, in response to the 2-bit flag signal 2BIT_FLAG. The refresh address latch unit 220 may output the latched refresh address LAT_REF_ADD to the address comparison unit 230, in response to the 2-bit flag signal 2BIT_FLAG. The address comparison unit 230 may compare the latched row address LAT_ROW_ADD with the latched refresh address LAT_REF_ADD. At this time, because the refresh address latch unit 220 has not yet received the refresh address REF_ADD from the address latch unit 210, a default value (not illustrated) is stored therein. Accordingly, the latched row address LAT_ROW_ADD may not match the latched refresh address LAT_REF_ADD.

Therefore, the address comparison unit 230 may output the match information SAME_INFO that is disabled to a low level 'L' to the address latch unit 210 and the refresh address latch unit 220.

Then, the address latch unit 210 may output the refresh address REF_ADD corresponding to the address at which the 2-bit error has occurred, to the refresh address latch unit 220 in response to the match information SAME_INFO which is disabled to the low level 'L'.

The refresh address latch unit 220 may output the refresh address REF_ADD received from the address latch unit 210, to the refresh control unit 240.

The refresh control unit 240 may change the refresh interval for the latched refresh address LAT_REF_ADD from the first interval to the second interval which is shorter than the first interval, and may control a refresh operation to be performed based on the second interval.

In a semiconductor device that performs a refresh operation, a time period that is sufficient to prevent loss of data stored in a memory cell is called a retention time, and a time period between two successive refresh operations of a certain memory cell is called a refresh time (tREF). That is, basically, a refresh time (tREF) must be shorter than a retention time. Generally, a refresh time (tREF) may be set to 64 ms in the specifications, but a retention time of some memory cells may become shorter than the refresh time (tREF) because the reliability is decreased due to continuous scaling of the memory cells in the semiconductor device. In this case, a 2-bit error may occur at an address corresponding to a specific memory cell having a retention time shorter than the refresh time (tREF). Accordingly, there is required controlling a refresh operation for the address where a 2-bit error has occurred such that the specific memory cell has a refresh interval shorter than the refresh time (tREF) of 64 ms, which is the preset refresh interval.

The refresh control unit 240 may control the refresh operation such that the refresh operation for the address at which 2-bit error has occurred, is performed based on the second interval that is shorter than the preset first interval of 64 ms, and may thereby relieve a defective memory cell corresponding to the address.

Meanwhile, when performing a refresh operation, the refresh control unit 240 may control one of an auto-refresh operation, a per-bank refresh operation, and a self-refresh operation to be performed.

Here, when an auto-refresh operation is performed, the auto-refresh operation may be performed for the latched refresh address LAT_REF_ADD stored in the refresh address latch unit 220 based on the second interval that is shorter than the first interval.

When a per-bank refresh operation is performed, remaining banks, exclusive of a bank that received a per-bank refresh command, perform a refresh operation for the latched refresh address LAT_REF_ADD stored in the refresh address latch unit 220, or perform a refresh operation for the latched refresh address LAT_REF_ADD and an address for which the per-bank operation is to be performed when mat information for the address for which the per-bank operation is to be performed differs from mat information for the latched refresh address LAT_REF_ADD stored in the refresh address latch unit 220 as a result of comparison therebetween. Like the auto-refresh operation, the per-bank refresh operation for the latched refresh address LAT_REF_ADD stored in the refresh address latch unit 220 may also be performed based on the second interval, which is shorter than the first interval.

When a self-refresh operation is performed, a refresh operation is performed based on a set interval, but the refresh interval for the latched refresh address LAT_REF_ADD stored in the refresh address latch unit 220 is set shorter than the set interval. For example, the set interval may include the first interval and the refresh interval may include the second interval.

The memory cell corresponding to the address, the refresh interval of which is adjusted as described above, may be refreshed again, and be sensed and amplified by the sense amplification unit 140.

The ECC control unit 150 detects error bits of the written data DAT outputted from the sense amplification unit 140 after the refresh interval is adjusted. When a 1-bit error occurs, the ECC control unit 150 may correct the 1-bit error, but when a 2-bit error occurs, the ECC control unit 150 may generate the 2-bit flag signal 2BIT_FLAG again and output the 2-bit flag signal to the address control unit 170.

The address latch unit 210 may latch the 2-bit error address, among the row addresses ROW_ADD, in response to the 2-bit flag signal, and the address comparison unit 230 may once again compare the latched row address LAT_ROW_ADD latched in the address latch unit 210 with the latched refresh address LAT_REF_ADD latched in the refresh address latch unit 220.

Since the refresh address latch unit 220 has already received and latched the refresh address REF_ADD which was previously provided from the address latch unit 210, the refresh address REF_ADD has been latched therein.

Accordingly, the address comparison unit 230 may compare the latched row address LAT_ROW_ADD outputted from the address latch unit 210 with the latched refresh address LAT_REF_ADD outputted from the refresh address latch unit 220, and may output the match information SAME_INFO depending on the result of the comparison.

When the latched row address LAT_ROW_ADD matches the latched refresh address LAT_REF_ADD, the address comparison unit 230 enables the match information SAME_INFO to a high level 'H', and may then output it to the address latch unit 210 and the refresh address latch unit 220.

When the latched row address LAT_ROW_ADD matches the latched refresh address LAT_REF_ADD, this indicates that a 2-bit error repeatedly occurs in the memory cell corresponding to the address for which the refresh interval been adjusted. In other words, because error occurs in the memory cell although the refresh interval was adjusted, it may be determined that the cell is not capable to store data, rather than losing data due to the refresh characteristics. Therefore, it is possible to control the corresponding memory cell to be repaired using a redundant memory cell.

Accordingly, the address latch unit 210 may output the latched row address as the repair address REP_ADD, and the refresh address latch unit 220 may reset the latched refresh address LAT_REF_ADD.

The row address repair unit 250 may receive the repair address REP_ADD, and repair the memory cell corresponding to the repair address REP_ADD using a redundant memory cell.

The respective steps of a method for relieving a defective cell of a semiconductor memory device will be described with reference to the flowchart illustrated in FIG. 3.

Figure 3:
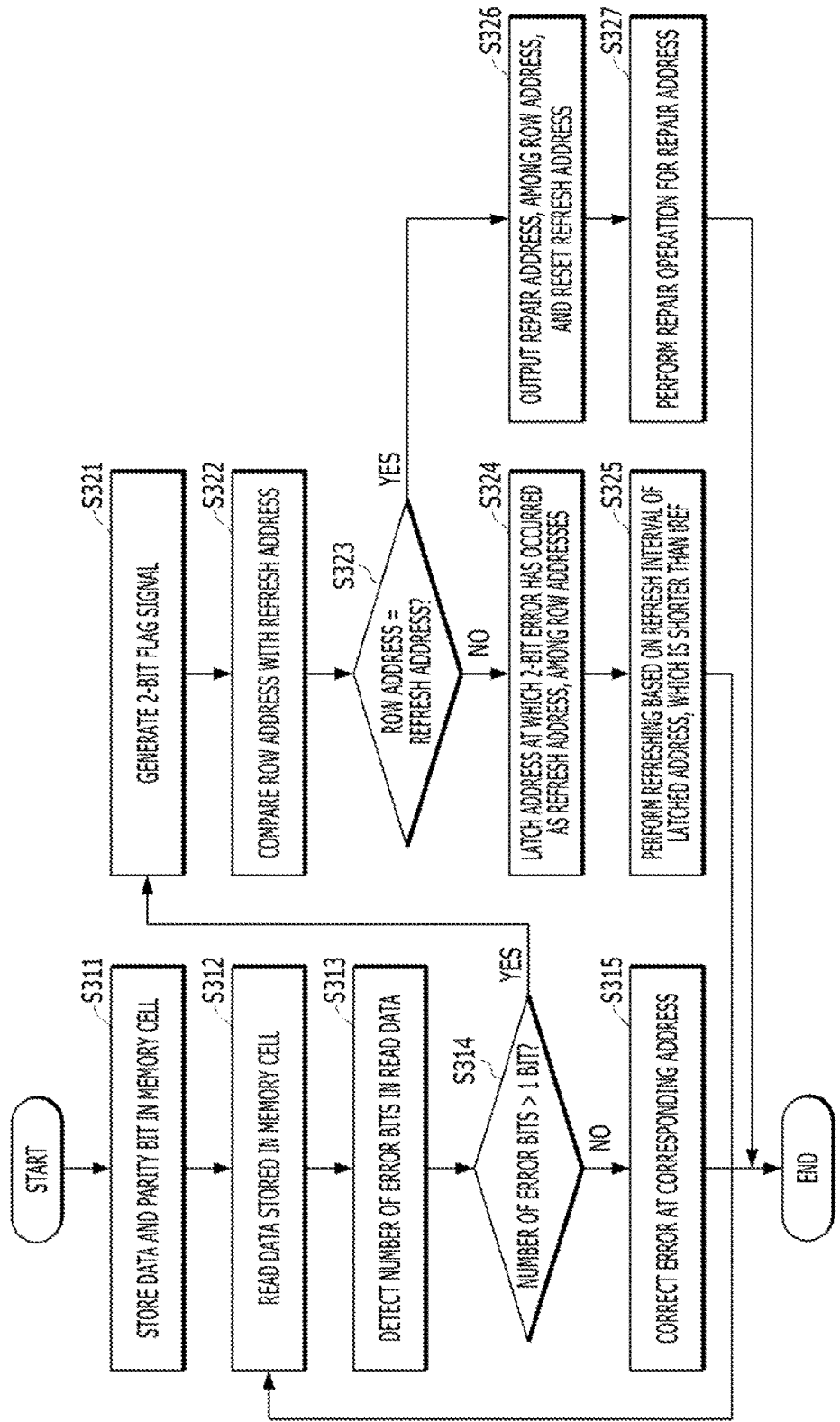
FIG. 3 is a flowchart illustrating an operation of the semiconductor memory device illustrated in FIG. 1.

FIG. 3 is a flowchart that shows an operation of the semiconductor memory device illustrated in FIG. 1.

Referring to FIG. 3, the semiconductor memory device may be operated through processes of storing data and parity bits in memory cells at step S311, reading data DAT stored in the memory cells at step S312, detecting the number of error bits of the read data at step S313, checking whether the number of error bits is greater than 1 bit at step S314, correcting error at an address of the read data at step S315 when the number of error bits is not greater than 1 bit, generating a 2-bit flag signal at step S321 when the number of error bits is greater than 1 bit, comparing a row address with a refresh address at step S322, checking whether the row address matches the refresh address at step S323, when the row address does not match the refresh address, latching the 2-bit error address, among the row addresses, as a refresh address at step S324, perform a refresh operation for the latched address based on an interval shorter than a refresh time (tREF), at step S325, when the row address matches the refresh address, outputting the 2-bit error address, among the row addresses, as a repair address, and resetting the refresh address at step S326, and performing a repair operation for the repair address at step S327.

First, at step S311, the data may be stored in the memory cell array 131 and the parity bits may be stored in the ECC cell array 132. Then, the sense amplification unit 140 may sense, amplify, and output the written data DAT stored in the memory cell, at step S312.

Although not illustrated in the flowchart, after data and parity bits are stored in the memory cell, the stored data may be refreshed based on a first interval (tREF=64 ms). The sense amplification unit 140 may sense, amplify, and output the refreshed data DAT.

Then, the ECC control unit 150 may detect the number of error bits of the read data at step S313, check whether the number of error bits is greater than 1 at step S314, and correct the error at the address of the read data at step S315 or generate a 2-bit flag signal 2BIT_FLAG at step S321. First, when the number of error bits is 1, the ECC control unit 150 may correct the error of the read data, but when the number of error bits is 2, the ECC control unit 150 may output the 2-bit flag signal 2BIT_FLAG.

The address control unit 170 may compare a row address with a refresh address.

More specifically, the address latch unit 210 may output the latched row address LAT_ROW_ADD in response to the 2-bit flag signal 2BIT_FLAG, the refresh address latch unit 220 may output the latched refresh address LAT_REF_ADD in response to the 2-bit flag signal 2BIT_FLAG, and the address comparison unit 230 may compare the latched row address LAT_ROW_ADD with the latched refresh address LAT_REF_ADD to output a match information SAME_INFO about whether the latched row address LAT_ROW_ADD latched in the address latch unit 210 matches the latched refresh address LAT_REF_ADD latched in the refresh address latch unit 220, at step S322.

When it is determined that the match information SAME_INFO denotes that the two addresses do not match each other ("NO" at step S323), the address latch unit 210 may output the latched row address LAT_ROW_ADD to the refresh address latch unit 220 as a refresh address REF_ADD, and the refresh address latch unit 220 may latch the refresh address REF_ADD as the latched refresh address LAT_REF_ADD, at step S324. The refresh control unit 240 may control a refresh operation for the latched refresh address LAT_REF_ADD to be performed based on a refresh interval that is shorter than tREF at step S325.

After the refresh operation is performed based on the adjusted refresh interval, data stored in the memory cell may be read again at step S312, and steps S313 to S321 may be repeatedly performed. When the 2-bit flag signal 2BIT_FLAG is generated again at step S321, the row address ROW_ADD is compared with the refresh address REF_ADD at step S322.

When the two addresses match each other ("YES" at step S323), it is determined that the memory cell corresponding to the address is not capable to store data, rather than losing the data due to the refresh characteristics. The address latch unit 210 may then output the latched row address to the row address repair unit 250 as the repair address REP_ADD, and the refresh address latch unit 220 may reset the latched refresh address LAT_REF_ADD, among the refresh addresses, at step S326. The row address repair unit 250 may receive the repair address REP_ADD, and repair the memory cell corresponding to the repair address REP_ADD address using a redundant memory cell, at step S327.

In conclusion, the semiconductor memory device according to an embodiment may detect error bits in a plurality of written data through the ECC control unit 150, correct a 1 bit error, and generate a 2-bit flag signal 2BIT_FLAG when a 2-bit error is detected. Then, through the address control unit 170, the latched row address LAT_ROW_ADD is compared with the latched refresh address LAT_REF_ADD in response to the 2-bit flag signal 2BIT_FLAG, and a defective memory cell is relieved by adjusting a refresh interval depending on the result of the comparison. Although the refresh interval is adjusted, when 2-bit error repeatedly occurs, the corresponding memory cell is repaired, whereby the defective cell in which the 2-bit error has occurred may be processed.

The semiconductor memory device according to the invention exhibits improved reliability and productivity by correcting errors or relieving memory cells having a short retention time depending on the number of error bits.

Although various embodiments have been described for illustrative purposes, it will be apparent to those skilled in the art that various changes and modifications may be made without departing from the spirit and scope of the disclosure as defined in the following claims.

What is claimed is:

1. A semiconductor memory device comprising:
   a memory core unit including a plurality of memory cells suitable for storing data;
   an error correction code (ECC) control unit suitable for detecting an error of the data to output a flag signal corresponding to a result of detection of the error; and
   an address control unit suitable for adjusting a refresh interval of at least one memory cell that stores data in which the error is detected, or repairing the memory cell among the memory cells, in response to the flag signal.

2. The semiconductor memory device of claim 1, wherein the address control unit is configured to adjust the refresh interval of the memory cell storing the data in which the error is first detected, and to repair the memory cell storing the data in which the error is repeatedly detected.

3. The semiconductor memory device of claim 1, wherein the address control unit comprises:
   an address latch unit suitable for latching a row address, outputting a latched row address in response to the flag signal, and outputting the latched row address as a refresh address or a repair address in response to match information about whether the row address matches a refresh address;
   a refresh address latch unit suitable for latching an address corresponding to a default value or the refresh address, outputting a latched refresh address corresponding to the default value the flag signal, and outputting the latched refresh address corresponding to the refresh address in response to the match information;
   an address comparison unit suitable for outputting the match information by comparing the latched row address with the latch refresh address corresponding to the default value;
   a refresh control unit suitable for adjusting the refresh interval of the memory cell corresponding to the refresh address latched in the refresh address latch unit; and
   a row address repair unit suitable for repairing the memory cell corresponding to the repair address.

4. The semiconductor memory device of claim 3, wherein the refresh address latch unit
   latches the refresh address when the match information denotes that the row address does not match the refresh address, and
   resets the refresh address latched therein when the match information denotes that the row address matches the refresh address.

5. The semiconductor memory device of claim 3, wherein the refresh control unit is configured to control a refresh operation to be performed as one of an auto-refresh operation, a self-refresh operation, and a per-bank refresh operation.

6. The semiconductor memory device of claim 1, wherein the ECC control unit is configured to detect an error bit of the data through Single Error Correct Double Error Detect (SECDED) code, to correct the error when the error bit is 1 bit, and to generate the flag signal when the error bit is 2 bits.

7. The semiconductor memory device of claim 1, wherein the address control unit is configured to adjust the refresh interval to be shorter than a preset refresh interval.

8. The semiconductor memory device of claim 1, wherein the error bit is detected when a retention time of the memory cell is shorter than a refresh time of the memory cell.

9. The semiconductor memory device of claim 1, further comprising:
   a command address input unit suitable for generating an internal command/address signal by decoding a command/address signal received from an external device;
   an access control unit suitable for generating a row address, a column address, and a sense amplifier control signal in response to the internal command/address signal;
   a sense amplification unit suitable for sensing and amplifying the data stored in the memory core unit in response to the sense amplifier control signal; and
   a data input/output unit suitable for outputting the data, the error of which is corrected by the ECC control unit, and receiving input data from the external device to the memory core unit.

10. The semiconductor memory device of claim 9, wherein the ECC control unit is configured to receive data sensed and amplified by the sense amplification unit in response to the column address.

11. The semiconductor memory device of claim 1, wherein the memory core unit further comprises:
   a plurality of ECC memory cells suitable for storing parity bits for checking and correcting the error of the data.

12. An operating method of a semiconductor memory device, comprising:
   storing data in at least one memory cell and storing a parity bit in at least one error correction code (ECC) memory cell;
   reading the data and the parity bit from the memory cell and the ECC memory cell;
   detecting the number of error bits of the data depending on the parity bit;

correcting error of the data when the number of error bits is 1 bit; and adjusting a refresh interval of the memory cell or repairing the memory cell when the number of error bits is greater than 1.

13. The operating method of claim 12, wherein the adjusting the refresh interval is performed when the number of error bits of the data is first detected as being greater than 1.

14. The operating method of claim 12, wherein the adjusting the refresh interval comprises:

latching a row address in response to a flag signal indicating a case in which the number of the error bits is greater than 1;

comparing the row address with a previously latched refresh address; and when the row address does not match the previously latched refresh address, latching the row address as the refresh address and adjusting the refresh interval of the memory cell corresponding to the row address.

15. The operating method of claim 12, wherein the refresh interval is adjusted to be shorter than a preset refresh interval.

16. The operating method of claim 12, wherein the repairing the memory cell is performed when the number of error bits of the data is repeatedly detected as being greater than 1.

17. The operating method of claim 12, wherein the repairing the memory cell comprises:

latching a row address in response to a flag signal indicating a case in which the number of the error bits is greater than 1;

comparing the row address with a previously latched refresh address; and when the row address matches the previously latched refresh address, repairing the memory cell corresponding to the row address.

18. The operating method of claim 17, the repairing the memory cell further comprises:

when the row address matches the previously latched refresh address, resetting the previously latched refresh address.

19. The operating method of claim 12, wherein the detecting the number of error bits of the data is performed by Single Error Correct Double Error Detect (SECDED) code.

* * * * *